United States Patent [19]
Visokay et al.

[11] Patent Number: 5,972,722
[45] Date of Patent: Oct. 26, 1999

[54] ADHESION PROMOTING SACRIFICIAL ETCH STOP LAYER IN ADVANCED CAPACITOR STRUCTURES

[75] Inventors: Mark R. Visokay; Luigi Colombo, both of Dallas, Tex.; Paul McIntyre, San Jose, Calif.; Scott R. Summerfelt, Garland, Tex.

[73] Assignee: Texas Instruments Incorporated, Dallas, Tex.

[21] Appl. No.: 09/060,152

[22] Filed: Apr. 14, 1998

Related U.S. Application Data

[60] Provisional application No. 60/042,982, Apr. 14, 1997.

[51] Int. Cl.[6] .................................................. H01G 7/06
[52] U.S. Cl. ............................. 438/3; 438/253; 438/240
[58] Field of Search ............................. 438/3, 238–241, 438/250–286, 381, 393–399

[56] References Cited

U.S. PATENT DOCUMENTS

| | | |
|---|---|---|
| 5,024,722 | 6/1991 | Cathey, Jr. . |
| 5,081,559 | 1/1992 | Fazan et al. . |
| 5,156,992 | 10/1992 | Teng et al. . |
| 5,173,442 | 12/1992 | Carey . |
| 5,198,384 | 3/1993 | Dennison . |
| 5,262,343 | 11/1993 | Rhodes et al. . |
| 5,264,076 | 11/1993 | Cuthbert et al. . |
| 5,293,510 | 3/1994 | Takenaka . |
| 5,302,547 | 4/1994 | Wojinarowski et al. . |
| 5,418,388 | 5/1995 | Okudaira et al. . |
| 5,466,629 | 11/1995 | Mihara et al. . |
| 5,468,342 | 11/1995 | Nulty et al. . |
| 5,530,279 | 6/1996 | Yamamichi et al. . |
| 5,562,801 | 10/1996 | Nulty . |
| 5,573,979 | 11/1996 | Tsu et al. . |
| 5,824,563 | 10/1998 | Hwang ........................................ 438/3 |
| 5,834,348 | 11/1998 | Kwon et al. ............................. 438/240 |

OTHER PUBLICATIONS

Tung–Sheng Chen, et al., Ir–Electroded BST Thin Film Capacitors for 1 Giga–bit DRAM Application, IEDM 96–679—96–682, 1996.

S. Yamamichi et al., An ECR MOCVD (Ba,Sr)TiO3 based stacked capacitor technology with RuO2/Ru/TiN/TiSix storage nodes for Gbit–scale DRAM, date and publisher unknown.

A. Yuuki, et al., Novel Stacked Capacitor Technology for 1 Gbit DRAMs with CVD–(Ba,Sr)TiO3 Thin Films on a Thick Storage Node of Ru, unknown date and publisher.

S. S. Roth et al., Offset Trench Isolation, J. Electrochem. Soc., vol. 141, No. 8, Aug. 1994, pp. 2178–2181.

Andrew G. Nagy, Anisotropic Organic Reactive Ion Etch Producing Minimal Sidewall Deposition, Motorola Technical Developments, vol. 6, Oct. 1986, Table of Contents page and p. 13.

Eimori, et al., "A Newly Designed Planar Stacked Capacitor Cell with High Dielectric Constant Film for 256 Mbit DRAM", 1993 IEDM Proceedings 631–634, Technical Digest.

Toyable, et al., "Memory Cell Capacitance Simulation in Three Dimensions", 1988VLSI Technology Symposium Digest 27–28.

*Primary Examiner*—Jey Tsai
*Attorney, Agent, or Firm*—Mark A. Valetti; Carlton H. Hoel; Richard L. Donaldson

[57] ABSTRACT

A high-k dielectric capacitor structure and fabrication method that incorporates an adhesion promoting etch stop layer 200 to promote adhesion of the bottom electrode 220 to the interlevel dielectric layer 210 and to provide a well controlled, repeatable and uniform recess prior to the dielectric 230 deposition. By using a sacrificial layer 200, for example silicon nitride (Si3N4), this layer can act as an etch stop during the recess etch to eliminate parasitic capacitance between adjacent capacitor cells A and B and can promote adhesion of the bottom electrode material 220 to the substrate 210.

11 Claims, 2 Drawing Sheets

ADHESION PROMOTING SACRIFICIAL ETCH STOP LAYER IN ADVANCED CAPACITOR STRUCTURES

This is a Non Provisional application filed under 35 USC 119(e) and claims priority of prior provisional, Ser. No. 60/042,982 of inventor Visokay, et al., filed Apr. 14, 1997.

BACKGROUND AND SUMMARY OF THE INVENTION

The present invention relates to integrated circuit memory device structures and fabrication methods.

Background: DRAMs

Memory device capacitor structures for gigabit dynamic random access memory (DRAM) applications typically include a bottom storage electrode formed over a polysilicon plug within the interlevel dielectric layer (e.g. silicon dioxide). The polysilicon plug is in contact with an underlying transistor. A dielectric layer that has a high dielectric constant is usually deposited over the bottom storage electrode, which provides the increased capacitance that these structures exhibit. A top electrode, which can be of the same material as the bottom storage electrode, can then be deposited over the resulting stacked cell capacitor structures. Similar architectures can also be used for FRAM (ferroelectric random access memory) cells, if the dielectric is ferroelectric.

Background: High Dielectric Constant Materials

For future memory device capacitor structures, high-dielectric-constant (high-k) materials such as barium strontium titanate (BST) or ferroelectric materials such as lead zirconium titanate (PZT) are leading candidates for the dielectric material, which serves to increase the amount of energy at a given voltage each capacitor can store. The very high dielectric constant of these advanced dielectric materials (possibly greater than 1000) imposes a new degree of criticality on the etching procedures. Any unnecessary lateral extension of the advanced dielectric material will increase the parasitic capacitance between laterally adjacent cells, which is highly undesirable.

Background: Bottom Electrode Materials

Promising candidates for bottom electrode materials include the eight noble metals (e.g. at least 50 percent atomic of any combination of the following: platinum, palladium, ruthenium, iridium, rhodium, osmium, silver, and gold) and their oxides (e.g. $RuO_2$, $IrO_2$, $Rh_2O_3$, $OsO_2$, and $PdO_2$). These eight metals (of which platinum is the most common) are all physically and chemically fairly similar, and all are quite stable (or form conductive oxides, so the capacitance is not degraded) in oxidizing, reducing, or inert atmospheres at high temperatures. In addition, these materials are resistant to hydrogen damage, and do not degrade the dielectric polarization after annealing at high temperatures.

A particularly important characteristic of DRAM electrode materials is the work function. (This number describes the energy required to remove one electron from the metal.) A dominant leakage mechanism in advanced DRAM cells is Schottky emission from the metal into the dielectric, so metals with a higher work function produce less leakage. Platinum has a notably high work function, and hence is particularly attractive for such applications, but the other noble metals, and their oxides, all have fairly high work functions as well.

Background: Problems with Parasitic Capacitance in Capacitor Cell Structures Prior art FIGS. 3A and 3B schematically show partially fabricated cell structures at two stages of a prior art process. (For clarity, the underlying transistors and overlying top electrode are not shown.) In each capacitor cell A and B, a barrier layer 340, such as TiAlN, separates the polysilicon plug 330 formed in the interlevel dielectric material 320 (e.g. $SiO_2$) from the bottom electrode 300. A dielectric layer 310 (e.g. BST) is also shown covering the entire structure, including each bottom electrode 300. The layer of advanced dielectric 310 (e.g. BST or PZT) is initially deposited as a continuous film extending between the capacitor cells (as shown in FIG. 3A). The cell might in theory be thought to be workable at this point (after the top plate is deposited and connected to a fixed potential), since the advanced dielectric is not itself a conductor. However, it is important to note that the extent of the advanced dielectric will produce a large secondary capacitor between the cells A and B, which can lead to significant parasitic capacitances and device degradation.

In order to minimize this parasitic capacitance, one approach would be to remove the dielectric 310 spanning the distance between the two capacitor nodes A and B by using a patterned etch to remove the dielectric material 310 between the cells A and B, as shown in prior art FIG. 3B. However, this solution is not desirable because it requires an additional patterning step. Moreover, the necessary alignment tolerances of the patterning and etching steps imply that the advanced dielectric will still have some lateral extent beyond the cell boundaries, and hence the parasitic capacitance will still be excessive.

Another approach, shown in prior art FIG. 3C, recesses the $SiO_2$ 320 between the storage nodes A and B slightly, by etching the $SiO_2$ 320 after the bottom electrode 300 definition, but before the dielectric deposition. Therefore, when the dielectric layer 310 is subsequently deposited, the parasitic capacitance between the cells A and B is reduced. A particular attraction of this structure is that, if a CVD deposition process leaves a thin portion of advanced dielectric material 310 where the vertical sidewall meets the lower flat portion of the interlevel dielectric, this thin portion will be remote from the region of enhanced electric field at the bottom corner of the gate.

However, with this approach it is difficult to repeatably etch a specific thickness into the oxide layer, and further, to etch it uniformly across entire wafers, because the formation of a well defined recess structure must be performed by etching the $SiO_2$ 320 for a given amount of time that is well calibrated to the removal rate. The etch rate must be constant both across the wafer and from wafer to wafer. Accomplishing a repeatable, uniform recess depth would therefore be difficult by this method.

Background: Problems with Bottom Electrode Material

Poor adhesion of the bottom electrode material to the interlevel dielectric material presents an additional disadvantage of the cell structures shown in FIGS. 3A–3C. It is well known that potential bottom electrode materials such as platinum, palladium, ruthenium and iridium (e.g. noble metals of the platinum family) adhere poorly to $SiO_2$, and therefore an adhesion promoting layer between the bottom electrode and dielectric material is desirable to prevent the bottom electrode material from lifting off of the $SiO_2$.

One conventional approach to the problem of adhesion of the bottom electrode incorporates an adhesion layer between the bottom electrode material and the interlevel dielectric, as discussed in U.S. Pat. No. 5,418,288 to Okudaira et al. (Okudaira). This adhesion layer is deposited prior to the formation of the contact to the underlying transistors. The bottom electrode material is then deposited over the polysilicon plugs and the adhesion material, which prevents the peeling off of the bottom electrode material from the interlevel dielectric. Processing then continues with the deposition of the dielectric layer and the top electrode. However, the adhesion layer does not produce a recessed structure, and thus the parasitic capacitance associated with advanced DRAM structures is not reduced.

Adhesion Promoting Sacrificial Etch Stop Structures and Methods

The present application discloses a capacitor structure and fabrication method that incorporates a sacrificial adhesion-promoting-etch-stop layer, for example silicon nitride, to adhere the bottom electrode to the interlevel dielectric layer and to provide a well controlled, repeatable and uniform recess prior to the dielectric deposition. The sacrificial layer can be deposited onto the substrate prior to the formation of the self aligned contact to the underlying transistors. After the formation of the bottom electrode, an etch with a high selectivity between the sacrificial layer and the underlying substrate (e.g. SiO2) can be used to remove the sacrificial layer from between the electrodes. This removal step is not shown in the Okudaira patent, instead the adhesion layer is present between the electrodes. This structure and method can advantageously be used in high-k capacitor structures in DRAMs in the ≧256 Mbit generations.

Advantages of the disclosed methods and structures include: yields significant improvements in recess formation depth repeatability (due to the etch stop); improves capacitor cell robustness (due to the use of an adhesion promoting etch stop material); and simplifies processing.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Sacrificial Layer Embodiment: Si3N4 Deposition

Figure 1:
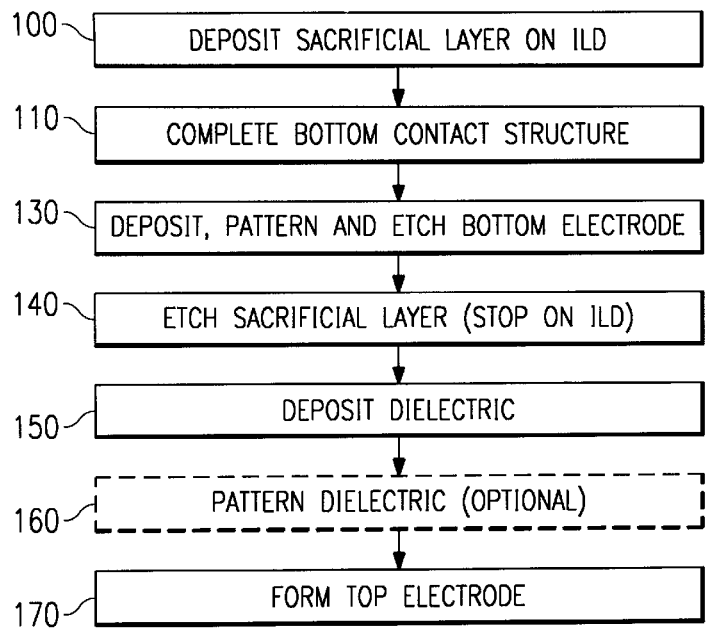
FIG. 1 shows a flow chart for fabricating a high-k dielectric capacitor structure in accordance with preferred embodiments of the present invention.
Figure 2A:
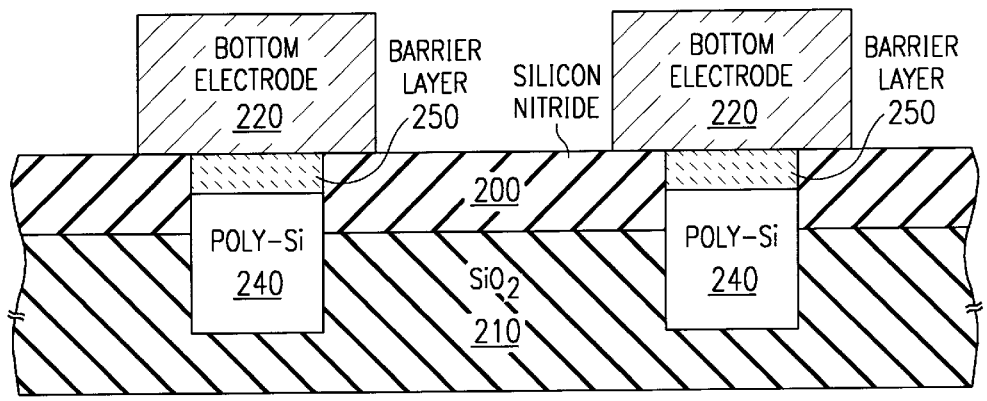
FIGS. 2A and 2B schematically illustrate a sample embodiment of the disclosed fabrication process of the present invention.
Figure 2B:
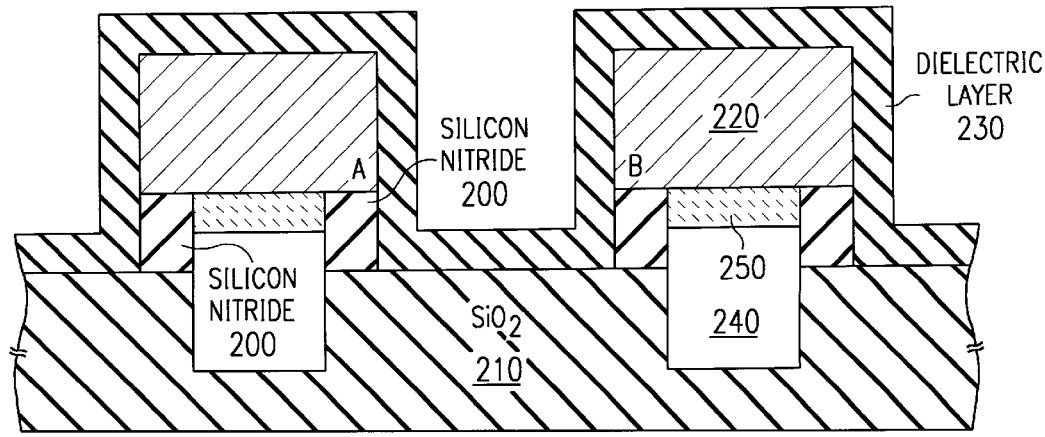
Figure 3A:
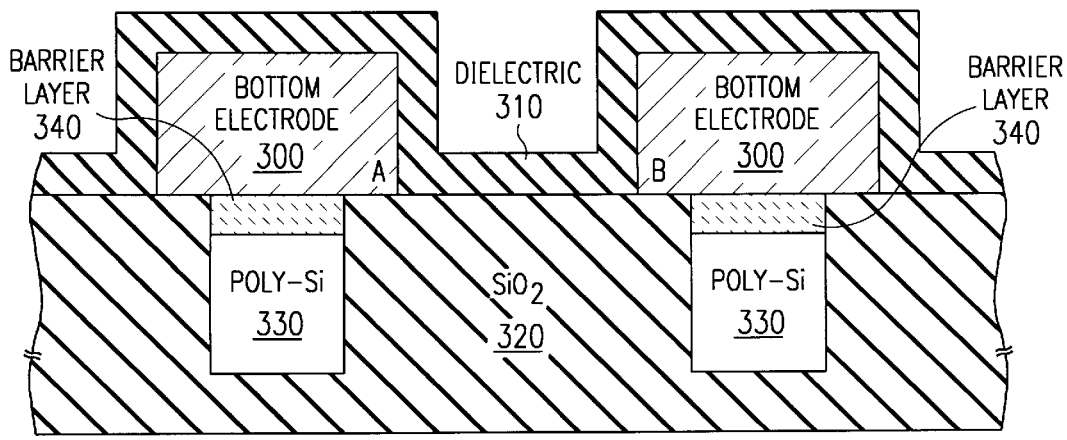
FIGS. 3A–3C schematically illustrate two prior art capacitor cell structures and conventional approaches to overcoming the parasitic capacitance effects of high-k capacitor cell structures.
Figure 3B:
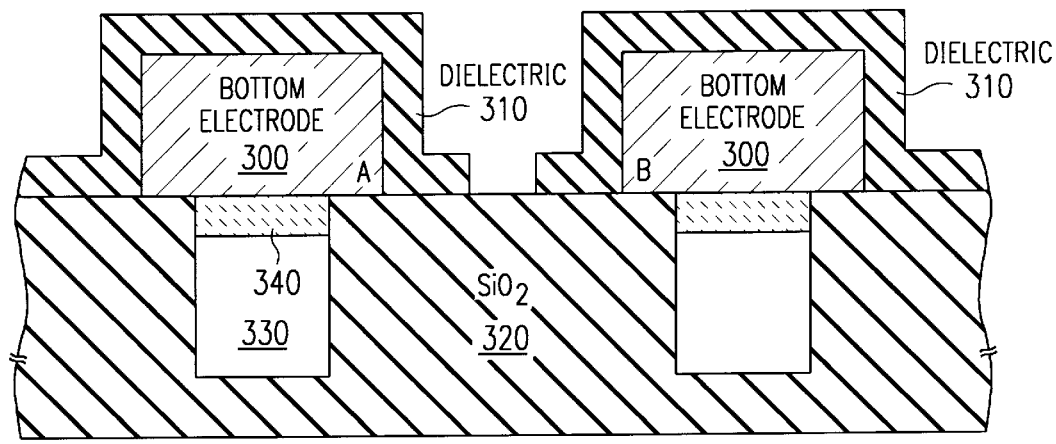
Figure 3C:
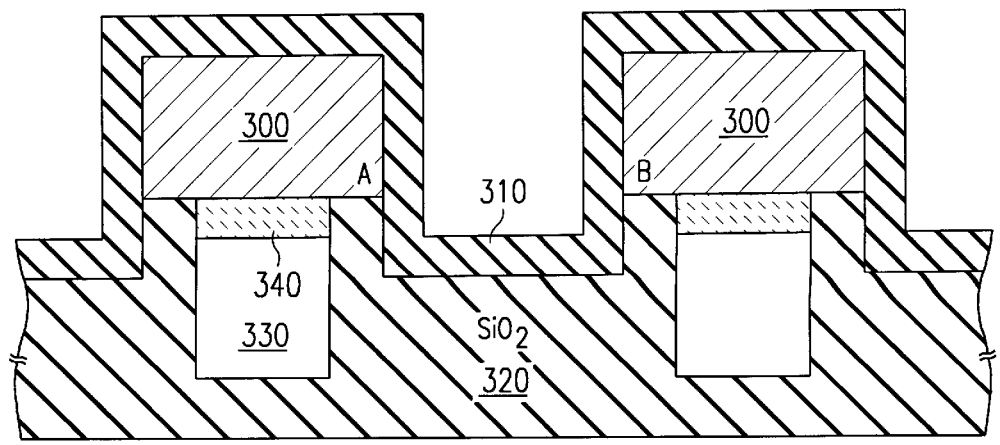

FIG. 1 shows a process flow for fabricating a capacitor cell structure using a high dielectric constant material, and FIGS. 2A and 2B schematically illustrate the formation of such a capacitor structure. The sacrificial layer 200 (e.g. silicon nitride (Si3N4)), which has a thickness between 10 and 100 nm (but preferably 30 nm) can be deposited onto the interlevel dielectric layer 210 (e.g. SiO2) (step 100), which has a thickness of approximately 400 nm (or 300 nm for thermal silicon oxide), prior to formation of the self aligned contact to the underlying transistors (not shown). The SiO2/ sacrificial layer stack 210/200 can then be patterned and etched (step 110) without the need for an extra lithography step (though a different etch chemistry is likely to be needed for the two layers). The enclosed bottom contact to the underlying transistor is then formed by a two-step deposition and patterning process: deposition of polysilicon 240, etchback, deposition of barrier layer 250 (e.g. TiAlN), and chemical mechanical polish (CMP).

The bottom electrode material 220, which has a thickness between 50 and 500 nm (preferably 300 nm) can then be deposited (e.g. by sputter deposition), patterned and etched (step 130), as can be seen in FIG. 2A, to form the adjacent capacitor plates. Subsequently, an etch (step 140) with high selectivity between the sacrificial layer 200 and the underlying oxide 210 can be used to remove the sacrificial layer 200 from between the adjacent capacitor plates, but leave the oxide 210 intact, as shown in FIG. 2B. The sacrificial layer (e.g. silicon nitride) is preferably etched using a conventional dry nitride etching process, The thin sacrificial layer 200 serves the dual purpose of an adhesion layer for the bottom electrode 220 and an etch stop layer. Thus, a well controlled, repeatable and uniform recess can be formed prior to dielectric 230 deposition (step 150). Furthermore, the thickness of the high-k dielectric layer 230 is also constant on the bottom electrode 220, with no corner effects. So long as the sacrificial layer thickness is well controlled, and suitable etch selectivity can be attained between the oxide layer 210 and sacrificial layer 200, a well defined etch thickness can be easily produced.

The dielectric layer (e.g. BST having a thickness of around 10 to 60 nm, but preferably 30 nm) is preferably deposited by chemical vapor deposition (CVD) under oxidizing conditions, but can alternatively be deposited by sputtering. The dielectric can then optionally be patterned (step 160), to further reduce the parasitic capacitance. However, a particular advantage of the disclosed process is that this dielectric patterning step is not necessary, and omission of this step is presently preferred. Processing is now completed conventionally, with formation of the top electrode (step 170) and succeeding steps. The top electrode having a thickness of around 20 to 100 nm, but preferably 50 nm, is preferably deposited using RF magnetron sputtering at 400 degrees C., but can alternatively be deposited by e-beam evaporation at 300 degrees C.

Second Sacrificial Layer Embodiment: TiO2

Alternatively, a layer of titanium oxide (TiO2) can be deposited or formed by oxidation of titanium onto the interlevel dielectric layer prior to the formation of the self aligned contact to the underlying transistors. The titanium oxide is predicted to serve as both an etch stop for yielding a repeatable recess depth and as an adhesion layer for the bottom electrode material.

Third Sacrificial Layer Embodiment: ZrO2

In a contemplated alternative embodiment, the sacrificial layer can be composed of ZrO2, which can be deposited or formed by oxidation. ZrO2 promotes good adhesion of the bottom electrode material, and with a highly selective etch chemistry, can act as an etch stop layer.

Fourth Sacrificial Layer Embodiment: Silicon Oxynitride

In a contemplated alternative embodiment, silicon oxynitride can be used instead of silicon nitride for the sacrificial layer material.

Fifth Sacrificial Layer Embodiment: Silicon-Rich Nitride

In another contemplated alternative embodiment, off-stoichiometric silicon nitride can be used instead of Si3N4 for the sacrificial material. Compositions for this embodiment include SiNx, where $0.5<x<1.34$.

Sixth Sacrificial Layer Embodiment: Oxide/Nitride Stack

Alternatively, a stack consisting of alternating layers of oxide and nitride, with one of the layers of nitride contacting the bottom electrode material, can potentially be used as the sacrificial material in order to promote adhesion of the electrode material to the hardmask and to serve as an etch stop layer.

Seventh Sacrificial Layer Embodiment: Silicon-Rich Oxide

In a predicted alternative embodiment, a stack of stoichiometric oxide (e.g. SiO2) over a silicon-rich oxide (e.g. SiO1.5) can be used instead of silicon nitride as a sacrificial layer. The silicon-rich oxide can be deposited from SiH4 and oxygen sources using a plasma enhanced CVD process. In experimental tests, it was found that the adhesion after deposition was better for films deposited with SiH4/O2 ratios greater than or equal to 1.0.

Eighth Sacrificial Layer Embodiment: Al2O3

In a contemplated alternative embodiment, Al2O3 can be used as the etch stop and adhesion layer, instead of Si3N4. Al2O3 can be deposited by CVD or by reactive sputtering.

First Bottom Electrode Embodiment: Platinum Electrode

The bottom electrode can preferably be formed from platinum, which is one of the noble metals. However, platinum does not adhere well to silicon dioxide, and therefore a sacrificial layer (e.g. silicon nitride) must be used to promote adhesion of the bottom electrode material to the interlevel dielectric layer.

Experimental results indicated that adhesion of nitrides to noble metals (e.g. platinum) was generally superior to that for any of the oxides tested, and overwhelmingly superior to that for CVD oxide. Furthermore, PECVD nitride appeared to be slightly superior to LPCVD nitride. However, LPCVD nitride appeared to be more durable to subsequent annealing than PECVD nitride. In addition, although PECVD nitride tends to be not as smooth as LPCVD nitride, PECVD nitride has the advantage that the composition does not have to be strictly stoichiometric. It has also been experimentally confirmed that PECVD nitride adheres well to underlying platinum.

The following data gives actual results obtained using sample embodiments of the present invention. The platinum etching was performed using a low pressure high density plasma reactive ion etch tool. Typical etch tools of this type are magnetically enhanced to allow the applied electromagnetic field to be absorbed by the gas to form a plasma. The particular tool used was a electron cyclotron resonance plasma using a 2.45 GHz microwave source. The ECR plasma was generated approximately 15 inches away from the chuck which had RF (13.56 MHz) power applied to it. The chuck was actively cooled using a clamp and He on the backside of wafer.

Platinum Etch

Cl2 Source Flow: 50 sccm
Pressure: 1.0 m/Torr
Chuck Temperature: 30 degrees C.
He Backside Pressure: 10 Torr
ECR Power: 1500 W
RF Power: 900 W
Pt Etch Rate: 150 nm/min Alternatively, for this particular equipment, the ECR power can range between 500–1500 W and the RF power can range between 100–1000 W. Similarly, gas flows and pressures between 20–80 sccm and 0.4–10 mTorr can be used with this tool. Other tools can have larger power supplies, different RF sources (plasma and chuck), and larger pumps and gas flows. In addition, alternative gas chemistries can be used (e.g. BCl3, HCl, SCl3, SF6, CxFy, Ar, Kr, Ne, He, Xe, O2, N2, and N2O).

Additional information on etching noble metals is found, e.g., in Shoji et al., "A 7.03 micron$^2$ Vcc/2-plate nonvolatile DRAM cell with a Pt/PZT/Pt/TiN capacitor patterned by one-mask dry etching," 1996 SYMPOSIUM ON VLSI TECHNOLOGY DIGEST 28 (1996); Nishikawa et al., "Platinum etching and plasma characteristics in RF magnetron and electron cyclotron resonance plasmas," 32 JAPANESE J. APPLIED PHYSICS PART 1 6102 (1993); and Harada et al., "N-InAlAs/InGaAs HEMT DCFL inverter fabricated using Pt-based gate and photochemical dry etching," E75-C IEICE TRANSACTIONS ON ELECTRONICS 1165 (1992); Mace et al., "Reactive ion etching of Pt/PZT/Pt ferroelectric thin film capacitors in high density DECR plasma," 29 Microelectronic Engineering 45 (1995); Voshchenkov, "Plasma etching processes for gigahertz silicon integrated circuits II," 2 INTERNATIONAL J. HIGH SPEED ELECTRONICS 45 (1991); all of which are hereby incorporated by reference.

Second Bottom Electrode Embodiment: Ruthenium Electrode

Alternatively, the bottom electrode can consist essentially of ruthenium. Ruthenium oxide can also be used as the electrode material when it is deposited over a thin layer of ruthenium (e.g. 50 to 100 nm), which serves as an oxidation barrier. However, if the electrode material comprises ruthenium, a lower deposition temperature must be used during the subsequent dielectric deposition to prevent the oxidation of ruthenium, as the formation of ruthenium oxide over the ruthenium electrode increases the surface roughness and therefore increases the leakage current. Ruthenium also has the disadvantage of forming the volatile RuO4, which is highly toxic and reactive.

Otherwise this embodiment is similar to the platinum embodiment given above. For other processing details, see Yamamichi et al., "An ECR MOCVD (Ba,Sr)TiO3 Based Stacked Capacitor Technology with RuO2/Ru/TiN/TiSix Storage Nodes for Gbit-scale DRAMs," 1995 IEDM 119; and Yuuki et al., "Novel Stacked Capacitor Technology for 1 Gbit DRAMs with CVD-(Ba,Sr)TiO3 Thin Films on a Thick Storage Node of Ru," 1995 IEDM 115; both of which are hereby incorporated by reference.

Third Bottom Electrode Embodiment: Iridium Electrode

Iridium can also be used as the bottom electrode material, and provides many advantages over platinum. Platinum generates alpha particles at levels approximately one hundred times larger than the maximum acceptable level for gigabit DRAM applications. Iridium, on the other hand, does not have any naturally occurring radioactive isotopes that would generate alpha particles. In addition, iridium adheres better to SiO2 than platinum, and therefore iridium provides more adhesion to the interlevel dielectric layer than does platinum. Moreover, iridium has a higher storage density than platinum and capacitors with an iridium top electrode have a higher capacitance density than platinum top electrode capacitors.

However, the leakage current density for iridium is slightly higher than that for platinum, but still within acceptable levels for gigabit DRAMs. Iridium capacitors also have a shorter lifetime than platinum capacitors, but the lifetime of iridium still meets DRAM requirements.

Fourth Bottom Electrode Embodiment: Palladium Electrode

In an alternative embodiment, the bottom electrode material can be formed from a sputtered layer of palladium. Otherwise this embodiment is similar to the platinum embodiment given above.

Fifth Bottom Electrode Embodiment: Osmium Electrode

In another contemplated alternative embodiment, the electrode structure can be fabricated using a sputtered layer of osmium instead of platinum. However, this embodiment has the particular disadvantage that osmium compounds (especially osmium tetraoxide) are extremely toxic. Otherwise this embodiment is similar to the platinum embodiment given above.

Sixth Bottom Electrode Embodiment: Rhodium Electrode

In a predicted alternative embodiment, the electrode structure can be fabricated using a sputtered layer of rhodium instead of platinum. Otherwise this embodiment is similar to the platinum embodiment given above.

First Top Electrode Embodiment: Platinum

In one embodiment, the top electrode can be formed from platinum, which is one of the noble metals.

Second Top Electrode Embodiment: Ruthenium

In another embodiment, the top electrode can be formed from ruthenium, which is one of the noble metals.

Third Top Electrode Embodiment: Iridium

In another embodiment, the top electrode can be formed from iridium, which is one of the noble metals.

Fourth Top Electrode Embodiment: Palladium

In another embodiment, the top electrode can be formed from palladium, which is one of the noble metals.

Fifth Top Electrode Embodiment: Osmium

In another embodiment, the top electrode can be formed from osmium, which is one of the noble metals.

Sixth Top Electrode Embodiment: Rhodium

In another embodiment, the top electrode can be formed from rhodium, which is one of the noble metals.

First Sacrificial Layer Deposition Process Embodiment: PECVD

Preferably, the sacrificial layer of silicon nitride is deposited using a plasma enhanced chemical vapor deposition (PECVD) process without annealing.

Second Sacrificial Layer Deposition Process Embodiment: LPCVD

Alternatively, the sacrificial layer (e.g. silicon nitride) can be deposited using a low pressure chemical vapor deposition (LPCVD) process. LPCVD silicon nitride advantageously yields good platinum adhesion even after annealing, and since post bottom electrode formation processing will involve elevated temperature steps, this is an important consideration.

Third Sacrificial Layer Deposition Process Embodiment: Jet Vapor

In an alternative embodiment, Jet Vapor Deposition can be used to deposit the sacrificial layer (e.g. Si3N4).

First Platinum Etch Chemistry Embodiment: Cl2

In one embodiment, the platinum bottom electrode can be formed by etching the platinum in desired locations using a Cl2 source with a flow rate of approximately 50 sccm. The etch rate of platinum under these conditions is around 90 nm/min. Furthermore, the etch rate of SiO2 under these conditions is around 100 nm/min.

Second Platinum Etch Chemistry Embodiment: Cl2/O2

In a preferred embodiment, the platinum can be etched using 25 sccm O2 and 25 sccm of Cl2. Under these conditions, the platinum etch rate decreases to approximately 60 nm/min. In addition, by adding oxygen to the etch chemistry, the formation of metal and organic residues on the bottom electrode material is prevented.

Third Platinum Etch Chemistry Embodiment: Cl2/ 20 percent O2

In an alternative embodiment, the bottom electrode can be formed by adding more than 20 percent oxygen to the Cl2 etch chemistry, with no more than 50 sccm total used during the etch. The addition of the oxygen reduces the formation of metal and organic polymers on the bottom electrode material (e.g. platinum) during the etch.

Fourth Platinum Etch Chemistry Embodiment: Cl2/ Ar

Alternatively, 25 sccm of Cl2 and 25 sccm of argon can be used to etch the bottom electrode material.

Fifth Platinum Etch Chemistry Embodiment: Cl2/ Ar/O2

Alternatively, a combination of Cl2, Ar, and O2, with no more than 50 sccm total, can be used to etch the bottom electrode material.

According to a disclosed class of innovative embodiments, there is provided: a method of reducing the parasitic capacitance in capacitor cell structures, comprising the steps of: (a.) depositing a noble metal layer over a first dielectric layer which overlies a second dielectric layer, said metal having better adhesion to said first dielectric layer than to said second dielectric layer; (b.) patterning and etching said metal layer to form adjacent capacitor plates; (c.) removing said first dielectric layer, but not said second dielectric layer, from between said adjacent capacitor plates, using an etch which is selective to said second dielectric layer; and (d.) depositing a blanket third dielectric layer having a dielectric constant higher than said first or second dielectric layer; wherein a recess having a known depth between said adjacent capacitor plates is defined.

According to another disclosed class of innovative embodiments, there is provided: a method of forming integrated circuit capacitor structures, comprising the steps of: (a.) forming vertical connections, each including a diffusion barrier layer, in recess of a first dielectric layer which overlies a second dielectric layer; (b.) depositing a layer of non-oxidizable metal over said first dielectric layer, said metal having better adhesion to said first dielectric layer than to said second dielectric layer; (c.) patterning and etching said metal layer to form plural capacitor plates; (d.) removing said first dielectric layer, but not said second dielectric layer, from between said adjacent capacitor plates, using an etch which is selective to said second dielectric layer; and (e.) depositing a blanket third dielectric layer having a dielectric constant higher than said first or second dielectric layer; wherein a recess having a known depth between said adjacent capacitor plates is defined; whereby the parasitic capacitance between said adjacent ones of said capacitor plates is reduced.

According to another disclosed class of innovative embodiments, there is provided: an integrated circuit capacitor structure, comprising: a noble metal layer and a first dielectric layer which are jointly patterned to form a plurality of capacitor bottom plates above a second dielectric layer; said first dielectric layer being absent between laterally adjacent ones of said capacitor bottom plates; and a third dielectric layer, having a dielectric constant greater than 100, overlying said capacitor bottom plates; whereby a recess having a known depth is defined between said adjacent capacitor plates to reduce the parasitic capacitance.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The disclosed process innovations are not limited to the specific DRAM cell structure shown, but can also be applied to other DRAM cell structures.

Of course, the specific etch chemistries, layer compositions, and layer thicknesses given are merely illustrative, and do not by any means delimit the scope of the claimed inventions.

For another example, a variety of diffusion barrier materials (e.g. TiN, WN, TiSiN, WSiN, TaN, TaSiN, TiWN, CrN, and CrAlN) can be substituted for the example given (e.g. TlAlN), and in some embodiments the diffusion barrier layer can even be omitted.

The invention can also be adapted to other combinations of dielectric materials in the interlevel dielectric. For example, it is contemplated that this can be a TEOS oxide, SiOxFy, or boroger-manophosphosilicate glass, rather than BPSG. Furthermore, the sacrificial layer can have a graded composition of nitride and oxide instead of the $Si_3N_4$ of the presently preferred embodiment.

The disclosed inventions are also useful with other high-k dielectrics, e.g. SBT (strontium bismuth tantalate) or PLZT (lead lanthanum zirconium titanate). High-k dielectrics typically achieve a dielectric constant on the order of 500, which is much higher than the values otherwise achievable (e.g. about 50 for $TiO_2$ or about 25 for tantalum pentoxide).

It should be noted that inert alloys of noble metals can be used as the bottom electrode material, in which the noble metals singly or in combination comprise at least 25 percent atomic of the material. In addition, the bottom electrode can consist of alternative metals, such as gold or rhenium.

What is claimed is:

1. A method of reducing the parasitic capacitance in capacitor cell structures, comprising the steps of:
   (a.) depositing a noble metal layer over a first dielectric layer which overlies a second dielectric layer, said metal having better adhesion to said first dielectric layer than to said second dielectric layer;
   (b.) patterning and etching said metal layer to form adjacent capacitor plates;
   (c.) removing said first dielectric layer, but not said second dielectric layer, from between said adjacent capacitor plates, using an etch which is selective to said second dielectric layer; and
   (d.) depositing a blanket third dielectric layer having a dielectric constant higher than said first or second dielectric layer;
   wherein a recess having a known depth between said adjacent capacitor plates is defined.

2. The method of claim 1, wherein said first dielectric layer is silicon nitride.

3. The method of claim 1, wherein said first and second dielectric layers each comprise at least 25 percent atomic of silicon, and said first dielectric layer, but not said second dielectric layer, comprises at least 25 percent atomic of nitrogen.

4. The method of claim 1, further comprising the subsequent step of depositing a top electrode which is capacitively coupled to said metal layer through said third dielectric layer.

5. The method of claim 1, wherein said metal layer consists essentially of platinum.

6. The method of claim 1, wherein said second dielectric layer comprises at least 25 percent atomic of silicon and at least 50 percent atomic of oxygen.

7. The method of claim 1, wherein said first dielectric layer is deposited using a plasma enhanced chemical vapor deposition process.

8. A method of forming integrated circuit capacitor structures, comprising the steps of:
   (a.) forming vertical connections, each including a diffusion barrier layer, in recess of a first dielectric layer which overlies a second dielectric layer;
   (b.) depositing a layer of non-oxidizable metal over said first dielectric layer, said metal having better adhesion to said first dielectric layer than to said second dielectric layer;
   (c.) patterning and etching said metal layer to form adjacent capacitor plates;
   (d.) removing said first dielectric layer, but not said second dielectric layer, from between said adjacent capacitor plates, using an etch which is selective to said second dielectric layer; and (e.) depositing a blanket third dielectric layer having a dielectric constant higher than said first or second dielectric layer;

wherein a recess having a known depth between said adjacent capacitor plates is defined;

whereby the parasitic capacitance between said adjacent capacitor plates is reduced.

9. The method of claim 8, wherein said first and second dielectric layers each comprise at least 25 percent atomic of silicon, and said first dielectric layer, but not said second dielectric layer, comprises at least 25 percent atomic of nitrogen.

10. The method of claim 8, further comprising the subsequent step of depositing a top electrode which is capacitively coupled to said metal layer through said third dielectric layer.

11. The method of claim 8, wherein said metal layer consists essentially of platinum.

* * * * *